(12) United States Patent
Usami et al.

(10) Patent No.: US 10,254,347 B2
(45) Date of Patent: Apr. 9, 2019

(54) FUEL CELL INSPECTION METHOD AND MANUFACTURING METHOD

(71) Applicant: TOYOTA JIDOSHA KABUSHIKI KAISHA, Toyota-shi, Aichi-ken (JP)

(72) Inventors: Sho Usami, Okazaki (JP); Koro Fujio, Toyota (JP); Masashi Maeda, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 632 days.

(21) Appl. No.: 14/887,417

(22) Filed: Oct. 20, 2015

(65) Prior Publication Data
US 2016/0116541 A1 Apr. 28, 2016

(30) Foreign Application Priority Data

Oct. 27, 2014 (JP) .................. 2014-218182

(51) Int. Cl.
*G01R 31/36* (2006.01)
*H01M 8/04537* (2016.01)
*H01M 8/04664* (2016.01)

(52) U.S. Cl.
CPC .... *G01R 31/3641* (2013.01); *H01M 8/04582* (2013.01); *H01M 8/04671* (2013.01); *G01R 31/3631* (2013.01); *G01R 31/3679* (2013.01); *H01M 2250/20* (2013.01); *Y02P 70/56* (2015.11); *Y02T 90/32* (2013.01)

(58) Field of Classification Search
CPC ............ G01R 31/3641; G01R 31/3679; G01R 31/3631; H01M 8/04582; H01M 8/04671; H01M 2250/20; Y02P 70/56; Y02T 90/32
See application file for complete search history.

(56) References Cited

U.S. PATENT DOCUMENTS

| 6,691,095 B2 * | 2/2004 | Singh ................. G01R 31/3651 320/130 |
| 8,076,044 B2 * | 12/2011 | Watanabe ............. H01M 8/247 429/514 |
| 2003/0215682 A1 * | 11/2003 | Takashita .......... H01M 8/04186 429/432 |
| 2005/0255355 A1 * | 11/2005 | Ukai ................... H01M 4/8621 429/486 |

(Continued)

FOREIGN PATENT DOCUMENTS

| JP | 2009-117066 A | 5/2009 |
| JP | 2011-28965 | 2/2011 |

(Continued)

OTHER PUBLICATIONS

English machine translation of JP 2009-117066 to Tanaka et al.*

(Continued)

*Primary Examiner* — Michael L Dignan
(74) *Attorney, Agent, or Firm* — Finnegan, Henderson, Farabow, Garrett & Dunner, LLP

(57) ABSTRACT

An inspection method for inspecting a fuel cell, comprising: rising current density at a speed of a designated speed or greater, and judging whether the fuel cell is normal or abnormal by comparing a first voltage value that is the voltage value when the current density reaches a designated current density or greater with the rising step, and a second voltage value which is a judgment standard.

7 Claims, 7 Drawing Sheets

(56) References Cited

U.S. PATENT DOCUMENTS

2007/0198707 A1     8/2007    Komachiya et al.
2013/0022883 A1     1/2013    Lee et al.

FOREIGN PATENT DOCUMENTS

JP        2013-26209     2/2013
JP        2013-122815    6/2013

OTHER PUBLICATIONS

Hongsirikarn et al. "Effect of cations (Na+, Ca2+, Fe3+) on the conductivity of a Nafion membrane." Journal of Power Sources 195 2010) 7213-7220, published May 2010 (Year: 2010).*

Collier et al. "Degradation of polymer electrolyte membranes." International Journal of Hydrogen Energy 31 (2006) 1838-1854, published Jul. 2006 (Year: 2006).*

Kelly et al. "Conductivity of polymer electrolyte membranes by impedance spectroscopy with microelectrodes." Solid State Ionics 176 (2005) 2111-2114 (Year: 2005).*

Okada et al. "Ion and Water Transport Characteristics of Perfluorosulfonated Ionomer Membranes with H+ and Alkali Metal Cations." J. Phys. Chem. B 2002, 106, 1627-1273 (Year: 2001).*

\* cited by examiner

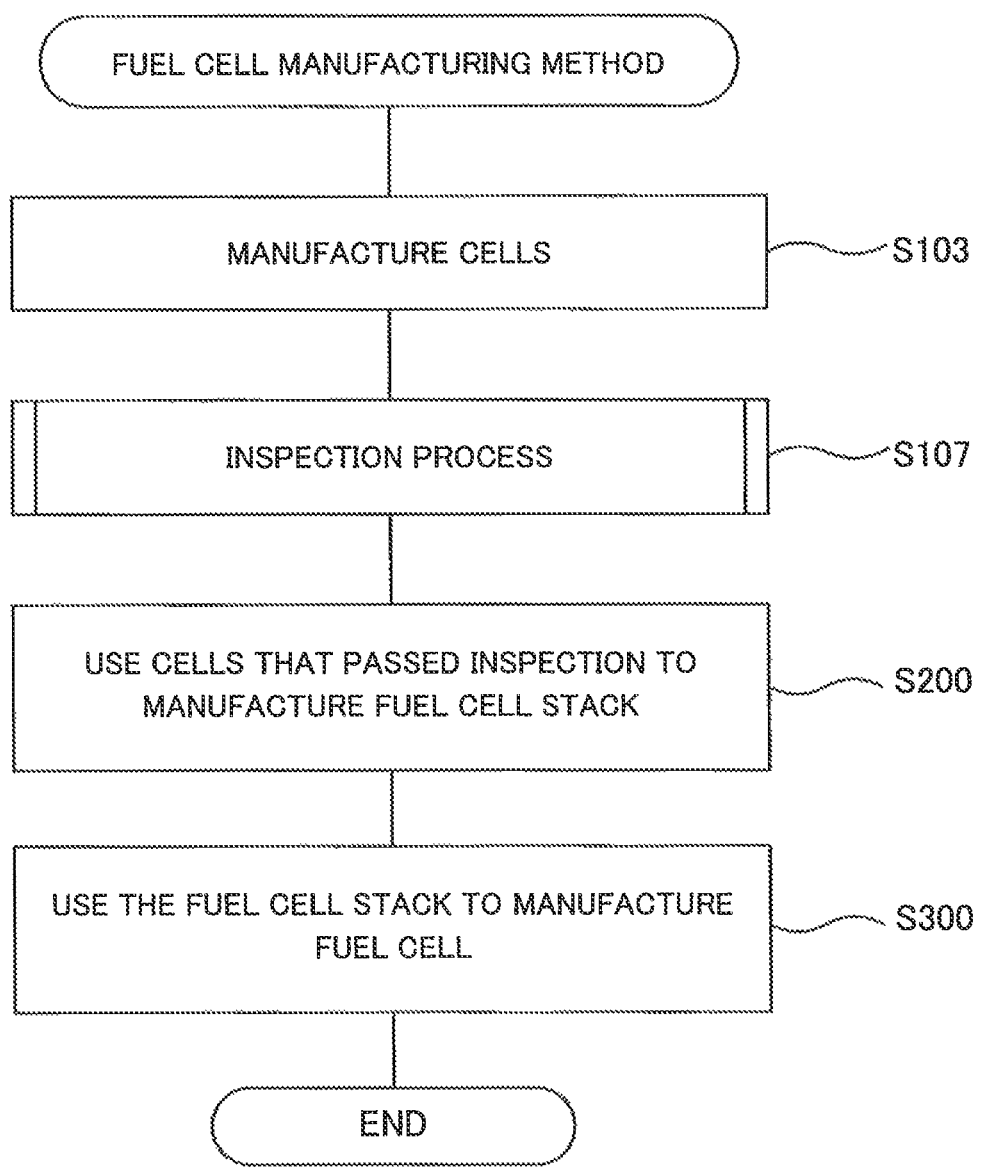

FUEL CELL INSPECTION METHOD AND MANUFACTURING METHOD

CROSS REFERENCE TO RELATED APPLICATIONS

This application claims priority rights based on the Japanese patent application of Application No. 2014-218182 applied for on Oct. 27, 2014, and all the disclosures thereof are incorporated herein by reference.

BACKGROUND

Field

The present invention relates to a fuel cell.

Related Art

The following technique is known as an inspection method for fuel cells containing ionomers. First, the maximum output of a fuel cell is measured during periodic inspection. When the measured value is 60% or less than a prescribed value, heat treatment (heating treatment) is implemented on the fuel cell. After the heat treatment, if the maximum output is greater than 60% of the prescribed value, it is judged that there is no problem with continuing use. The reason for making this kind of judgment is because it is assumed that the reason that the maximum output value before heat treatment was 60% or less than the prescribed value is ionomer swelling. The reason it is possible to make this kind of assumption is because ionomer swelling is recovered from using heat treatment (JP2013-122815).

In the case of the prior art noted above, there is no consideration for inspection of output with transient operating conditions. The invention of this application addresses the problem of realizing inspection of output with transient operating conditions in consideration of the prior art noted above.

SUMMARY

The present invention was created to address the problem noted above, and can be realized as the aspects noted below.

According to an aspect, provided is a method for inspecting a fuel cell. This method includes (a) rising current density at a speed of a designated speed or greater, and (b) judging whether the fuel cell is normal or abnormal by comparing a first voltage value that is the voltage value when the current density reaches a designated current density or greater in the step (a), and a second voltage value which is a judgment standard. With this aspect, it is possible to do inspection for transient operating conditions. Judging based on the first voltage value is because this reflects transient operating conditions. The transient operating conditions being reflected is because the first voltage value is the voltage value at the time when the current density is raised at a speed of a designated speed or greater, and has reached the designated current density or greater.

With the aspect noted above, the second voltage value may be a cell voltage after a designated time has elapsed after completion of the step (a), and in the step (b), when a voltage difference which is the difference between the second voltage and the first voltage is a reference value or greater, this can be judged as abnormal. With this aspect, it is possible to perform judging without taking into consideration variation due to individual differences in fuel cells.

With the aspects noted above, in the step (b), when the voltage difference may be the reference value or greater, that can be judged as a first abnormality, and when the second voltage value is less than the designated value, it can be judged as a second abnormality which is different from the first abnormality. With this aspect, it is possible to distinguish between the first abnormality and the second abnormality.

With the aspects noted above, the second voltage value may be a predetermined fixed value, and in the step (b), when the first voltage value is less than the second voltage value, this can be judged, as abnormal. With this aspect, the inspection time becomes shorter.

With the aspects noted above, the designated speed may be 0.5 $A/(cm^2 \cdot sec)$.

With the aspects noted above, the current density at the time the step (a) is completed may be the current density during maximum output in the usage range of that fuel cell. With this aspect, inspection is possible for cases that reach maximum output.

With the aspects noted above, the current density before the rising starts may be 0.2 $A/cm^2$ or less. With this aspect, it is possible to do inspection in a case when the current density rises from 0.2 $A/cm^2$ or less.

The aspects may be realized in various forms other than what is noted above. For example, in the step (b), when the voltage difference is less than the reference value, when the second voltage value is a threshold value or greater, this can be judged as normal. Alternatively, it may be realized in an aspect such as a manufacturing method of a fuel cell including the inspection method noted above, a computer program for realizing the inspection method noted above, a non-temporary storage medium on which this computer program is stored or the like.

BRIEF DESCRIPTION OF THE DRAWINGS

FIG. 9 is a process drawing showing the manufacturing method of the fuel cell.

DESCRIPTION OF THE EMBODIMENTS

Figure 1:
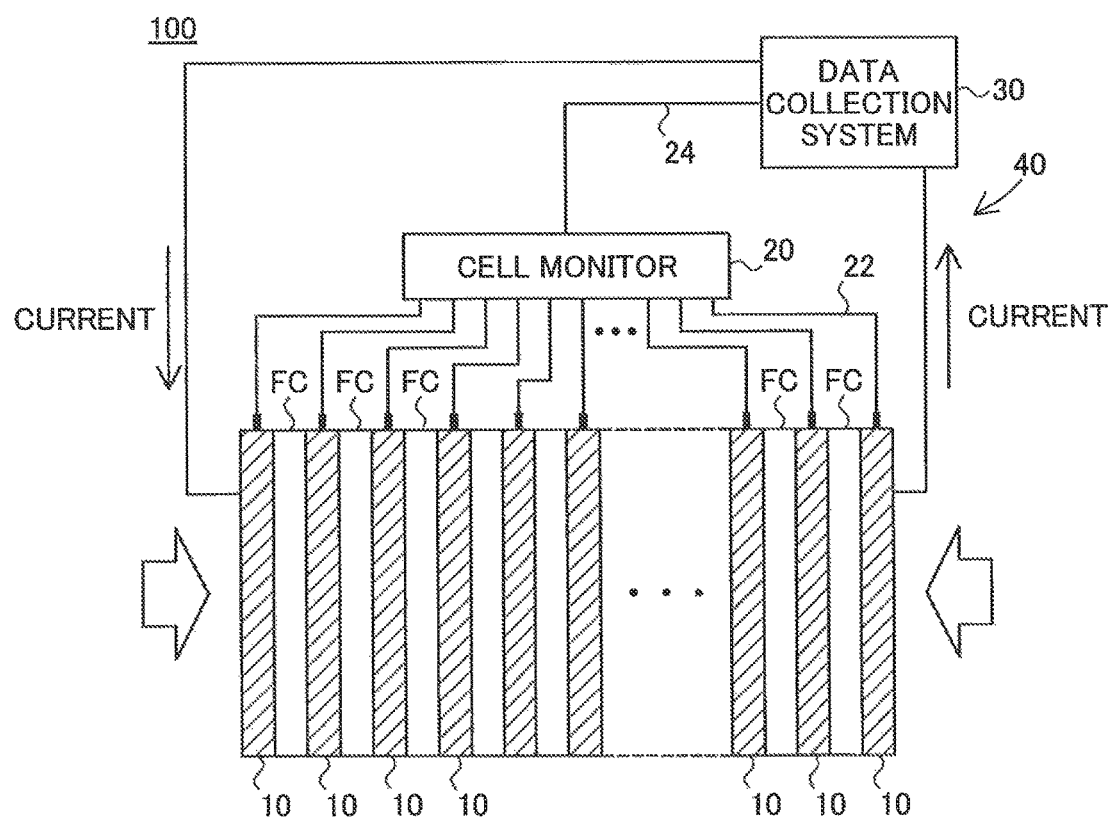
FIG. 1 is a schematic block diagram of a power generation inspection system.

FIG. 1 shows the schematic constitution of a power generation inspection system 100. The power generation inspection system 100 is a system for inspecting a fuel cell stack of an automobile. The power generation inspection system 100 is equipped with intermediate plates 10, a cell monitor 20, and a data collection system 30. The fuel cell stack has a stack structure for which a plurality of cells FC are laminated. The cell FC has a power generating body and a separator sandwiching the power generating body. The power generating body includes an MEA (membrane electrode assembly). The MEA is constituted by joining a cathode electrode, an electrolyte membrane, and an anode electrode.

The intermediate plates 10 are arranged between cells FC. A laminated body consisting of the plurality of cells FC and the plurality of intermediate plates 10 is fastened by applying a load in the direction shown by the white arrow in FIG. 1.

The cell monitor 20 is a device for measuring the cell voltage of each cell IT. The cell monitor 20 is connected to each of the plurality of intermediate plates 10 via a cell monitor cable 22.

The data collection system 30 is connected to the cell monitor 20 via a power cable 24. The data collection system 30 acquires the cell voltage of each cell FC measured by the cell monitor 20. The data collection system 30 forms a closed circuit 40 with the aforementioned laminated body. The data collection system 30 controls the current value flowing in the closed circuit 40 using a built-in circuit.

The power generation inspection system 100 is equipped with a fuel gas supply system (not illustrated) for supplying hydrogen to the plurality of cells FC, an oxidizing gas supply system (not illustrated) for supplying air to the plurality of cells FC, and a cooling water supply system (not illustrated) for flowing cooling water to the plurality of intermediate plates 10. The relative humidity of the supplied air is controlled to a designated value. The designated value is a value for reproducing the operation with air supplied, to the cathode without humidifying (operation without humidification).

Figure 2:
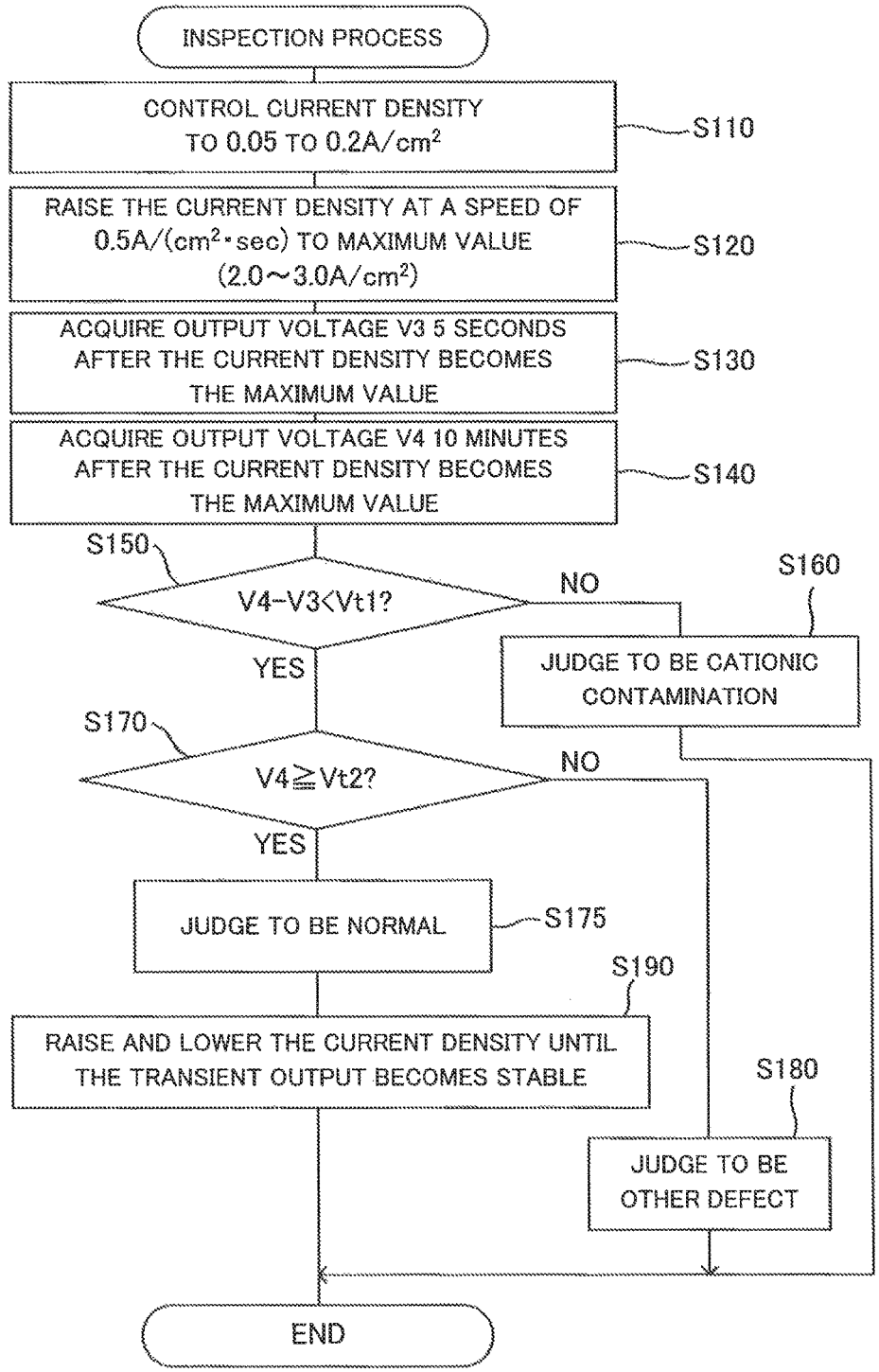
FIG. 2 is a process drawing of the inspection process.

FIG. 9 is a process drawing showing the manufacturing method of the fuel cell. First, workers manufacture the plurality of cells FC (step S103). Next, the inspection process is implemented (S107). Next, the workers manufacture a fuel cell stack using the cells FC that passed inspection with the inspection process (S200). Then, the workers manufacture the fuel cell using the manufactured fuel cell stack (S300). FIG. 2 is a process drawing of the inspection process. The inspection process is executed by the data collection system 30 to inspect each cell. FC. During the inspection process, the necessary amounts of hydrogen, air, and cooling water are supplied.

Figure 3:
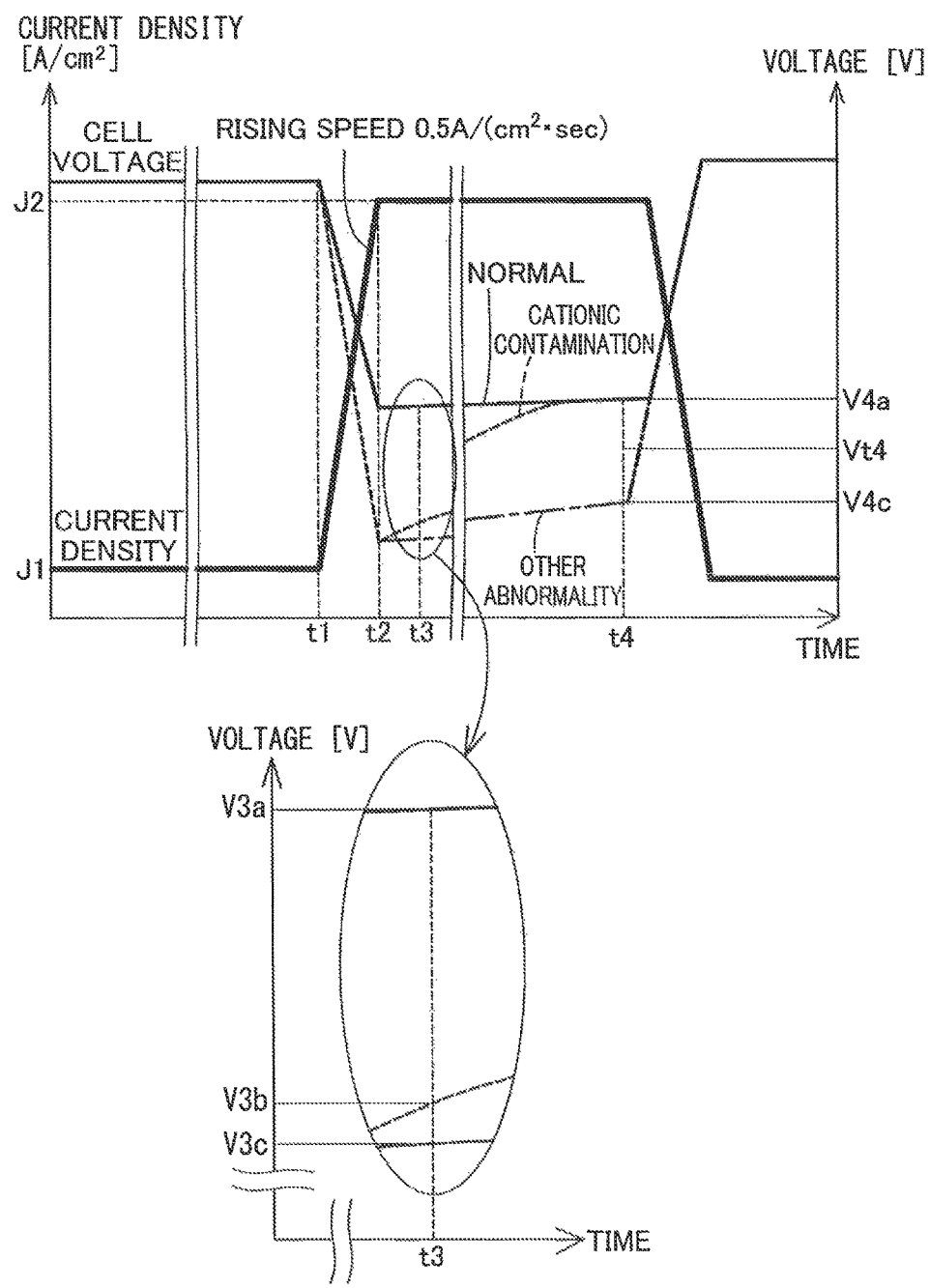
FIG. 3 is a graph showing the state of the cell voltage and current density changing with the inspection process.

FIG. 3 is a graph showing the state of the cell FC cell voltage and current density changing. Following, we will describe the inspection process while referring to FIG. 3.

First, the data collection system 30 controls the current density of each cell EV to a designated value J1 (step S110). The designated value J1 is the current density for realizing operation with little generated water, and with this embodiment, it is any value that is 0.05 A/cm$^2$ or greater and 0.2 A/cm$^2$ or less. Control of the current density is realized by controlling the current value flowing in the closed circuit 40. The calculation of the current density is realized by dividing the current value flowing in the closed circuit 40 by the surface area value of the power generating region of each cell FC. This surface area value is input in advance to the data collection system 30.

Next, the data collection system 30 raises the current density to a maximum value J2 (step S120). The maximum value J2 is the current density during maximum output of the fuel cell, and with this embodiment, is 2.0 A/cm$^2$ or greater and 3.0 A/cm$^2$ or less. The rising speed is set to 0.5 A/(cm$^2$·sec). FIG. 3 shows the state of the start of current density rising from time t1 to the end of current density rising at time t2. When the current density rises, the cell voltage drops as shown in FIG. 3 according to the voltage-current characteristics of the cells FC.

Subsequently, after a designated elapsed time after the current density reaches the maximum value J2 (time t3), the data collection system 30 acquires the cell voltage V3 of each cell FC (step S130). The designated time is any time from 0 to 10 seconds, and with this embodiment, 5 seconds is used.

FIG. 3 shows the state of voltage V3a being acquired when normal, voltage V3b being acquired in the case of cationic contamination, and V3c being acquired in the case of other abnormality.

Cationic contamination is a phenomenon of a sulfonate group included in an electrolyte membrane being toxified by a cation. The cation is, for example, a positive ion such as of iron, aluminum, nickel, cerium, cobalt or the like. There are various reasons that these cations contaminate the electrolyte membrane. For example, they may contaminate it as foreign matter with the manufacturing process, or may contaminate it by being eluted from other members during power generation. Iron, aluminum and nickel contaminate it during the manufacturing process, and there are cases when they are eluted from auxiliary parts or separators and contaminate it. Cerium and cobalt sometimes are eluted from oxidation inhibitors (radical quenchers) and contaminate it. When the sulfonate group is toxified by a cation, there is an increase in resistance of proton conduction, and in particular, the output when dry decreases.

After step S130, the data collection system 30 maintains the current density at the maximum value J2, and after a designated time has elapsed (time t4), the data collection system 30 acquires the cell voltage V4 of each cell FC (step S140). 10 minutes is used as the designated time with this embodiment. FIG. 3 shows the state of the voltage V4a being acquired when normal and in the case of cationic contamination, and V4c being acquired in the case of another abnormality.

Next, for each cell FC, the data collection system 30 judges whether the difference between the cell voltage V4 and the cell voltage V3 (hereafter referred to as "voltage difference ΔV") is less than a threshold value Vt1 (step S150). When there is a cell FC for which the voltage difference ΔV is the threshold value Vt1 or greater (step S150, No), the data collection system 30 judges that cell FC is a defective item for which cationic contamination has occurred (step S160).

In the case of the previously described cationic contamination, the voltage difference ΔV is (voltage V4a—voltage V3b), and is the threshold voltage Vt1 or greater. In contrast to this, when normal, the voltage difference ΔV is (voltage V4a-V3a), and for other abnormalities, the voltage difference ΔV is (voltage V4c—voltage V3c), and in either case is less than the threshold voltage Vt1.

Figure 4:
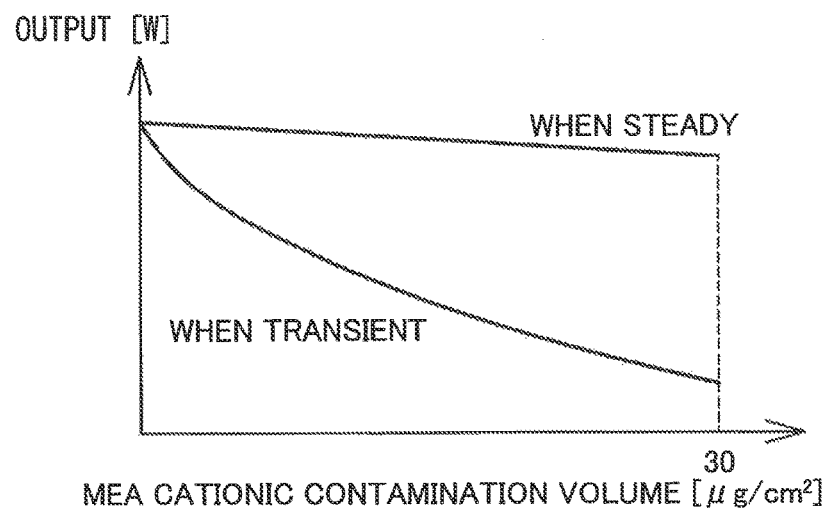
FIG. 4 is a graph showing the relationship between output and cationic contamination volume per unit area.
Figure 5:
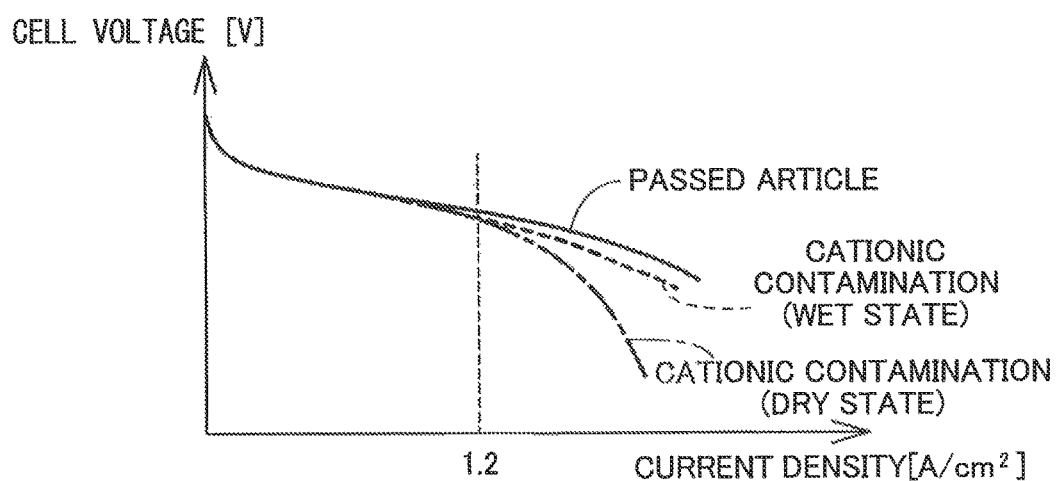
FIG. 5 is a graph showing the voltage-current characteristics of the fuel cell.

FIG. 4 is a graph showing the relationship between fuel cell output (W) and cationic contamination volume (μg/cm$^2$) per MEA unit area. FIG. 5 is a graph showing the fuel cell voltage/current characteristics. Following, using these two graphs, we will describe the influence of cationic contamination.

The graph shown in FIG. 4 shows the characteristics when steady and the characteristics when transient. "When steady" means the period when the current density is controlled to be constant. "When transient" means immediately after the rise of the current density as described as step S120 of the inspection process. These characteristics are when the current density is high (designated value of 1.2 A/cm$^2$ or greater).

As shown in FIG. 4, when steady, even when the cationic contamination volume increases, the output does not decrease much. In contrast to this, when transient, when the cationic contamination volume increases, there is a significant decrease in output.

Meanwhile, the graph shown in FIG. 5 shows the characteristics in the case of a passed article for which the cationic contamination volume is less than the reference value, and the characteristics in the case of a rejected article for which the cationic contamination volume is the reference value or greater. In the case of the rejected article, both times of wet conditions and dry conditions are shown. The wet condition is the state when the moisture volume contained in the electrolyte membrane constituting the MEA has reached a volume for good proton conduction. Conversely, the dry condition is the state when the moisture volume is less than the volume for good proton conduction.

As shown in FIG. 5, when the current density is low, there is almost no difference in either case. On the other hand, when the current density is larger, a difference starts gradually from near where 1.2 A/cm$^2$ is exceeded. In other words, even with the same current density, the cell voltage is lower for the rejected articles than for passed articles. The larger the current density is, the larger the difference becomes. However, with wet conditions, the decrease in output is milder compared to with dry conditions.

The reason of the change in the influence of cationic contamination by whether it is wet conditions or dry conditions is that both dryness and cationic contamination cause an increase in proton conduction resistance. In other words, in the case of wet conditions, even if cationic contamination occurs, proton conductivity does not significantly worsen, whereas in the case of dry conditions, proton conductivity is influenced by both the cationic contamination and dryness of the electrolyte membrane, and worsens significantly.

What we can derive from the contents noted above that were explained together with FIG. 4 and FIG. 5 is that measuring cell voltage with high current density and in dry conditions makes it snap to detect cationic contamination. However, when current density is high, the volume of generated water is high, resulting in wet conditions. Thus, it is not possible to realize the measurement conditions noted above simply by making the current density high. In light of that, with this embodiment, by rapidly raising the current density as with step S120, the measurement conditions noted above were realized. In other words, with low current density, the volume of generated water is low, so by rapidly raising the current density from that state, high current density and dry conditions were realized simultaneously.

With the inspection process, when the voltage difference ΔV is less than the threshold value Vt1 (step S150, Yes), the data collection system 30 makes a judgment for each cell FC of whether the cell voltage V4 is the threshold value Vt4 or greater (step S170). When there is a cell FC for which the cell voltage V4 is less than the threshold value Vt4 (step S170, No), the data collection system 30 judges that the cell FC is a defective article due to an abnormality other than cationic contamination (step S180). The threshold value Vt4 is the threshold value set experimentally as the voltage value that should be satisfied during maximum output.

In this way, after steady operation that maintains a high current density is continued, if the cell voltage is not recovered, the reason it is possible to judge this as a defective article due to other than cationic contamination is because as was described previously, the influence of cationic contamination becomes dormant when the electrolyte membrane is in wet conditions.

When there is a cell FC for which the cell voltage V4 is the threshold value Vt4 or greater (step S170, Yes), the data collection system 30 judges that the cell FC is normal (step S175). As is described later with FIG. 6, the data collection system 30 raises and lowers the current density is until the transient output becomes stable (step S190). Step S190 is executed to prepare for shipping of cells FC judged to be normal. After step S190, the cells FC judged to be normal are assembled as constitutional components of the fuel cell.

Meanwhile, cells FC judged to be abnormal at steps S160 and S180 are discarded or given for recycling.

Figure 6:
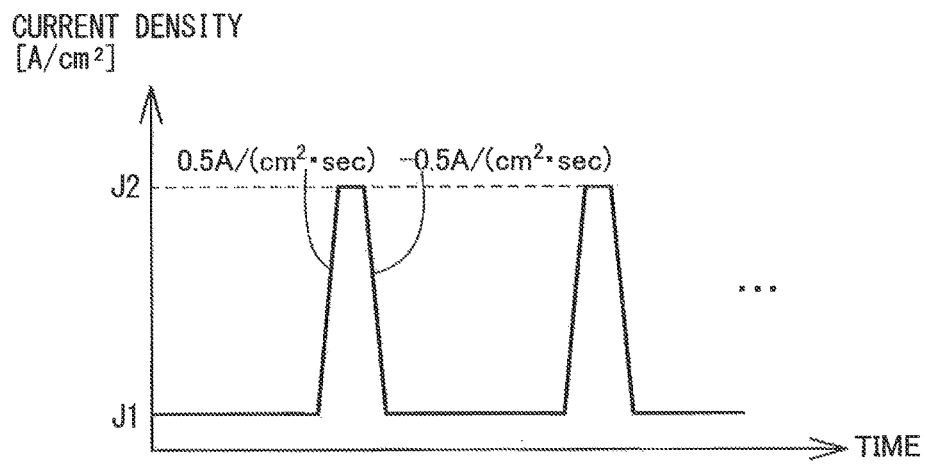
FIG. 6 is a graph showing the state of raising and lowering the current density.

FIG. 6 is a graph showing the state of the current density changing with step S190. As shown in FIG. 6, maintaining of the designated value J1, rising at 0.5 A/(cm$^2$·sec), maintaining at the maximum value J2, and dropping at −0.5 A/(cm$^2$·sec) is repeated. Transient output is the cell voltage immediately after the current density has reached the maximum value J2.

Figure 7:
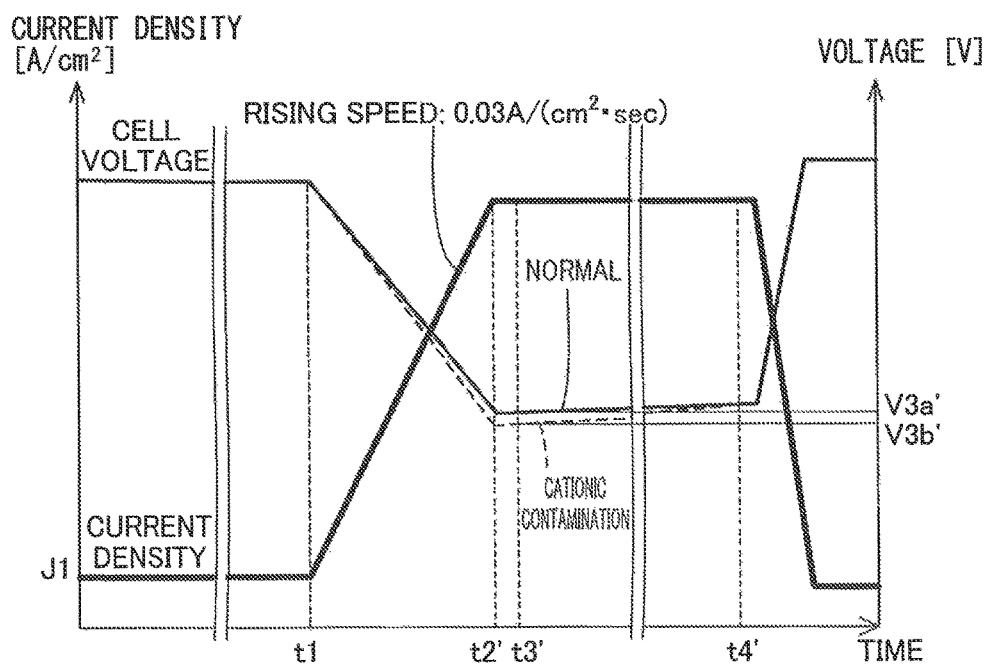
FIG. 7 is a graph showing the state of the cell voltage and current density changing (comparison example).
Figure 8:
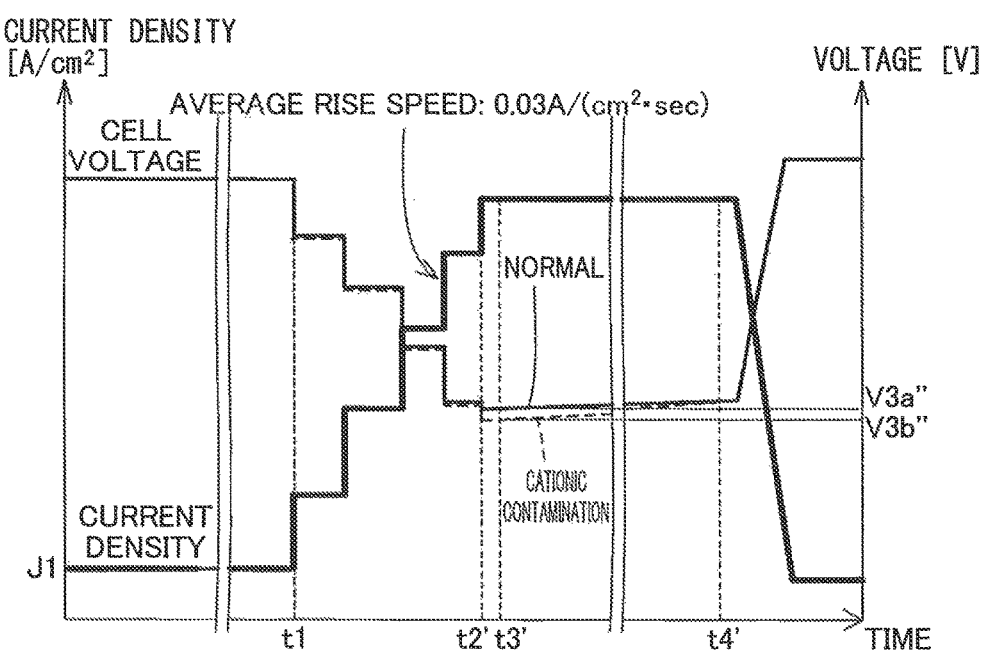
FIG. 8 is a graph showing the state of the cell voltage and current density changing (comparison example).

FIG. 7 and FIG. 8 are graphs for describing comparison examples. FIG. 7 and FIG. 8 shows the behavior of the cell voltage when the step S120 with the inspection process is changed.

FIG. 7 shows a case when at step S120, the current density is raised linearly, and the rising speed is set to 0.03 A/(cm$^2$·sec). FIG. $ shows a case when the current density is raised in stages, and the average rising speed is set to 0.03 A/(cm$^2$·sec). In other words, in either case, compared to the embodiment, the current density is raised gently.

As shown in FIG. 7, the difference between the cell voltage V3$a'$ when normal at time t3' and the cell voltage V3$b'$ when there is cationic contamination is smaller than with the embodiment. Thus, the difference for the voltage difference ΔV is also smaller between when normal and when cationic contamination. Similarly for the case of FIG. 8 as well, the difference between the cell voltage V3$a''$ when normal and the cell voltage V3$b''$ with cationic contamination is smaller than with the embodiment. Thus, with these techniques, detection of cationic contamination is more difficult than with the embodiment.

With the embodiment described above, it is possible to detect with good precision the decrease in output during transient times due to cationic contamination. When output is low during transient times, even when the driver steps on the accelerator pedal, there is not much acceleration, so it is easy for the driver to sense this as a problem. Thus, being able to detect with good precession the output decrease during transient time for the manufacturing process is useful.

The cause of a decrease in output during transient times is not limited to the cationic contamination shown by example with the embodiment. In other words, even if there is a decrease in output during transient times due to another reason, with the inspection process of this embodiment, it is possible to detect the output decrease with good precision.

The aspect is not limited to the embodiments, working examples, or modification examples of this specification, and may be realized with various constitutions within a scope that does not stray from its gist. For example, it is possible to replace or combine as appropriate the technical features in the embodiments, working examples, and modification examples corresponding to the technical features in each embodiment noted in the summary of the aspects section in order to address part or all of the problems described previously, or to achieve a part or all of the effects described previously. If that technical feature is not described as being essential in this specification, it may be eliminated as appropriate. Following are possible examples.

The speed for raising the current density does not have to be 0.5 A/(cm$^2$·sec), in other words, it may be 0.5 A (cm$^2$·sec) or less (e.g. 0.4 A/(cm$^2$·sec), or may be 0.5 A (cm$^2$·sec) or greater (e.g. 0.6 A/(cm$^2$·sec)). The speed for raising the current density is sufficient as long as it is a speed that brings changes from the operating state at low current density to an operation state for which there is high current density and the electrolyte membrane is in a dry condition.

Raising of the current density does not have to be linear, and may be also non-linear or in stages. In this case, the rising speed may be calculated by averages.

The time for measuring the transient state by the rise in current density may be before completion of the rise in density. For example, even if it is one second before the rise completion, it is believed that it is possible to detect a difference between passed articles and rejected articles due to cationic contamination.

As long as the time t3 is immediately after the current density was raised is a time before becoming a steady state operation, any time is acceptable. For example, it may be at any time after elapsing of any time (e.g. 20 seconds) from the point when the current density became the maximum.

As long as the time t4 after a designated time has elapsed after the current density is raised is a time after the cell voltage is stabilized, any time is acceptable. For example, it may be after the elapse of any time (e.g. 5 to 20 minutes) from the time when the current density became the maximum.

When the cell voltage V3 immediately after rising of the current density is less than a reference value set in advance as a fixed value, it may be judged as abnormal. If doing this kind of judging, the inspection time becomes shorter. What is called a fixed value here means a value that is fixed so as to not be affected even if the cell voltage fluctuates during inspection. Of course, it is also possible to make it possible to give instructions for changes of the values to the data collection system as an inspection adjustment, and possible to have values that cannot be changed.

In the case of the judgment technique noted above, it is also possible to not differentiate between other types of abnormalities.

Instead of the voltage difference $\Delta V$, when the value for which the cell voltage V4 (cell voltage when steady) is divided by the cell voltage V3 is compared with the reference value, when that value is the reference value or greater, it is also possible to judge that as abnormal.

The current density designated value J1 and the maximum value J2 may be any values.

The fuel cell subject to inspection does not have to be for an automobile, but may be any item for which there are cases when the current density rises rapidly during use. For example, it may be also an item mounted in another transportation equipment (train, ship or the like).

The inspection of this application may be also executed as an inspection after shipping. For example, it may be also executed as a periodic inspection.

At least a portion of the functions and processes realized using software with the embodiments noted above may be also realized using hardware. Also, at least a portion of the functions and processes realized using hardware may be realized using software. As hardware, for example, it is possible to use various types of circuits (circuitry), such as integrated circuits, discrete circuits, or circuit modules combining those circuits, for example.

What is claimed is:

1. An inspection method for inspecting each cell of a fuel cell stack including a plurality of cells, comprising:
    (a) rising current density in the plurality of cells at a speed of a designated speed or greater by controlling a current value flowing in the fuel cell stack, and
    (b) judging whether a relationship between a voltage and a current in power generation of each cell is normal or abnormal by comparing a first voltage value that is the voltage value when the current density reaches a designated current density or greater in the step (a), and a second voltage value which is a cell voltage after a designated time has elapsed after completion of the step (a), wherein the designated time is in a range from 5 minutes to 20 minutes,
    wherein in the step (b), the fuel cell is judged to be abnormal as a first type of abnormality caused by cationic contamination when a voltage difference which is a difference between the second voltage value and the first voltage value is equal to or greater than a first threshold value.

2. The inspection method according to claim 1, wherein in the step (b), the fuel cell is judged to be abnormal as a second type of abnormality that is different from the first type of abnormality when the difference between the second voltage value and the first voltage value is less than the first threshold value, and when the second voltage value is less than a second threshold value.

3. The inspection method according to claim 1, wherein in the step (b), the fuel cell is judged to be normal when the voltage difference between the second voltage value and the first voltage value is less than the first threshold value, and when the second voltage value is equal to or greater than a second threshold value.

4. The inspection method according to claim 1, wherein the designated speed is 0.5 A/(cm$^2$·sec).

5. The inspection method according to claim 1, wherein the current density at the time the step (a) is completed is the current density during maximum output in the usage range of that fuel cell.

6. The inspection method according to claim 1, wherein the current density before the step (a) starts is 0.2 A/cm$^2$ or less.

7. A manufacturing method of a fuel cell stack, wherein each cell is inspected before being assembled into a stack of cells comprising cells that passed the inspection method according to claim 1.

* * * * *